(12) United States Patent  
Imaoka

(10) Patent No.: US 7,064,443 B2  
(45) Date of Patent: Jun. 20, 2006

(54) SEMICONDUCTOR DEVICE HAVING A PLURALITY OF STACKED SEMICONDUCTOR CHIPS WITH POSITIONS OF CHIP-SELECTING TERMINALS BEING DIFFERENT FROM EACH OTHER

(75) Inventor: Norio Imaoka, Takamori-machi (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/807,438

(22) Filed: Mar. 24, 2004

(65) Prior Publication Data

US 2004/0217468 A1 Nov. 4, 2004

(30) Foreign Application Priority Data

Mar. 27, 2003 (JP) ............................. 2003-088221

(51) Int. Cl.
*H01L 23/48* (2006.01)
*H01L 29/41* (2006.01)
(52) U.S. Cl. ...................................... 257/777; 257/786
(58) Field of Classification Search ........ 257/690–700, 257/723–726, 777, 778

See application file for complete search history.

(56) References Cited

U.S. PATENT DOCUMENTS

| 5,165,067 A | * | 11/1992 | Wakefield et al. .......... 257/786 |
| 6,426,560 B1 | | 7/2002 | Kawamura et al. |

FOREIGN PATENT DOCUMENTS

| JP | 03-181163 | 8/1991 |
| JP | 06-132476 | 5/1994 |
| JP | A-07-142673 | 6/1995 |
| JP | A 2001-053243 | 2/2001 |
| JP | 2002-050735 | 2/2002 |
| JP | 2003-060053 | 2/2003 |

* cited by examiner

*Primary Examiner*—Howard Weiss
*Assistant Examiner*—Marcos D. Pizarro-Crespo
(74) *Attorney, Agent, or Firm*—Oliff & Berridge, PLC

(57) ABSTRACT

A semiconductor chip includes a semiconductor substrate, terminals of A (A is an integer equal to or larger than two groups that are included in each of groups, and an integrated circuit. A plurality of terminals in each of the groups are arranged in accordance with predetermined basic terminal arrangement. Each of the A groups is disposed at each of positions that are defined by rotating one of the positions around a point. Each of the groups includes same-function terminals Vdd (Vss, OE, and WE) to achieve the same function at the same positions of the basic terminal arrangement to enable the same semiconductor chips to be stacked.

3 Claims, 11 Drawing Sheets

SEMICONDUCTOR DEVICE HAVING A PLURALITY OF STACKED SEMICONDUCTOR CHIPS WITH POSITIONS OF CHIP-SELECTING TERMINALS BEING DIFFERENT FROM EACH OTHER

BACKGROUND OF THE INVENTION

1. Field of Invention

The present invention relates to a semiconductor chip, a semiconductor device, a method of manufacturing the same, a circuit board, and electronic equipment.

2. Description of Related Art

A semiconductor device manufactured by stacking a plurality of semiconductor chips having through-electrodes has been known in the related art. If a plurality of identical semiconductor chips is used in order to manufacture such a stacked-type semiconductor device, terminals that are at the same positions of the stacked semiconductor chips are electrically coupled to each other. For example, chip-selecting terminals are electrically coupled to each other. A plurality of semiconductor chips whose positions of chip-selecting terminals are different from each other, therefore, need to be stacked. Thus, the identical semiconductor chips can not be stacked in the related art.

SUMMARY OF THE INVENTION

The present invention is intended to enable substantially identical semiconductor chips to be stacked.

A semiconductor chip according to one aspect of the present invention includes a semiconductor substrate and terminals of A groups (A is an integer equal to or larger than 2 (two)) formed on the semiconductor substrate. Each of the groups includes a plurality of terminals. The semiconductor chip also includes an integrated circuit formed on the semiconductor substrate. The plurality of terminals in each of the groups are arranged in accordance with predetermined basic terminal arrangement. Each of the groups is disposed at each of positions that are defined by rotating one of the positions around a point. Each of the groups includes same-function terminals to achieve the same function at the same positions of the basic terminal arrangement. According to the present invention, substantially identical semiconductor chips can be stacked.

In the semiconductor chip, the same-function terminals of each of the groups may be electrically coupled to each other.

In the semiconductor chip, each of the groups may include a group of contact/non-contact terminals at a same positions group of the basic terminal arrangement. The group of contact/non-contact terminals includes a contact terminal that is electrically coupled to a same-function circuit and non-contact terminals that are electrically isolated from the same-function circuit. The contact terminal may be disposed at a different position of the basic terminal arrangement for each of the groups In the semiconductor chip, the contact terminal of each of the groups may be electrically coupled to each other.

In the semiconductor chip, the number of terminals of the group of contact/non-contact terminals may be equal to or larger than the number of the groups.

In the semiconductor chip, the non-contact terminals may be electrically isolated from the integrated circuit.

In the semiconductor chip, the integrated circuit may include a converter. The converter includes B conversion input parts (B is an integer equal to or larger than 2 (two)) and has the function of selecting at least one signal, among a group of predetermined output signals of the same kind, in response to an input signal input to the conversion input parts. The terminals of the groups may include C conversion terminals (C is an integer equal to or larger than 2 (two)) that are electrically coupled to the conversion input parts. Each of the conversion terminals may be electrically coupled to one of the conversion input parts. Each of the groups may include the conversion terminals in the number of C/A at the same positions of the basic terminal arrangement.

In the semiconductor chip, the conversion terminals in the number of C/A in each of the groups may include D first conversion terminals (D is a natural number) that are electrically coupled to each other. Each of the groups may include the first conversion terminals at the same positions of the basic terminal arrangement.

In the semiconductor chip, B may be a number other than a number divisible by the A. D may be a remainder that results from the division of the B by the A.

In the semiconductor chip, the conversion terminals in the number of C/A in each of the groups may include second conversion terminals that are electrically isolated from any other conversion terminals. Each of the groups may include the second conversion terminals at the same positions of the basic terminal arrangement.

In the semiconductor chip, the integrated circuit may include an element array that has a plurality of elements having the same function, and E element-array input parts (E is an integer equal to or larger than 2 (two)) for each being electrically coupled to any of the elements. The terminals of the groups may include F element-array terminals (F is an integer equal to or larger than 2 (two)) that are electrically coupled to the element-array input parts. Each of the groups may include the element-array terminals in the number of F/A at the same positions of the basic terminal arrangement.

In the semiconductor chip, the element-array terminals in the number of F/A in each of the groups may include G first element-array terminals (G is a natural number) that are electrically coupled to each other. Each of the groups may include the first element-array terminals at the same positions of the basic terminal arrangement.

In the semiconductor chip, the E may be a number other than a number divisible by the A. The G may be a reminder that results from the division of the E by the A.

In the semiconductor chip, the element-array terminals in the number of F/A in each of the groups may include second element-array terminals that are electrically isolated from any other element-array terminals. Each of the groups may include the second element-array terminals at the same positions of the basic terminal arrangement.

A semiconductor chip according to another aspect of the present invention includes a semiconductor substrate and terminals of A groups (A is an integer equal to or larger than 2 (two)) formed on the semiconductor substrate. Each of the groups includes a plurality of terminals. The semiconductor chip also includes an integrated circuit formed on the semiconductor substrate. The plurality of terminals in each of the groups are arranged in accordance with predetermined basic terminal arrangement. Each of the groups is disposed at each of positions that are defined by rotating one of the positions around a point. Each of the groups includes a group of contact/non-contact terminals at a same positions group of the basic terminal arrangement. The group of contact/non-contact terminals includes a contact terminal that is electrically coupled to a same-function circuit and non-contact terminals that are electrically isolated from the same-function circuit. The contact terminal is disposed at a different position of the basic terminal arrangement for each of the groups. According to the present invention, the same semiconductor chips can be stacked.

In the semiconductor chip, the contact terminal of each of the groups may be electrically coupled to each other.

In the semiconductor chip, the number of terminals of the group of contact/non-contact terminals may be equal to or larger than the number of the groups.

In the semiconductor chip, the non-contact terminals may be electrically isolated from the integrated circuit.

In the semiconductor chip, the integrated circuit may include a converter. The converter includes B conversion input parts (B is an integer equal to or larger than 2 (two)) and has the function of selecting at least one signal among a group of predetermined output signals of the same kind in response to an input signal input to the conversion input parts. The terminals of the groups may include C conversion terminals (C is an integer equal to or larger than 2 (two)) that are electrically coupled to the conversion input parts. Each of the conversion terminals may be electrically coupled to one of the conversion input parts. Each of the groups may include the conversion terminals in the number of C/A at the same positions of the basic terminal arrangement.

In the semiconductor chip, the conversion terminals in the number of C/A in each of the groups may include D first conversion terminals (D is a natural number) that are electrically coupled to each other. Each of the groups may include the first conversion terminals at the same positions of the basic terminal arrangement.

In the semiconductor chip, B may be a number other than a number divisible by the A. D may be a remainder that results from the division of the B by the A.

In the semiconductor chip, the conversion terminals in the number of C/A in each of the groups may include second conversion terminals that are electrically isolated from any other conversion terminals. Each of the groups may include the second conversion terminals at the same positions of the basic terminal arrangement.

In the semiconductor chip, the integrated circuit may include an element array that has a plurality of elements having the same function, and E element-array input parts (E is an integer equal to or larger than 2 (two)) for each being electrically coupled to any of the elements. The terminals of the groups may include F element-array terminals (F is an integer equal to or larger than 2 (two)) that are electrically coupled to the element-array input parts. Each of the groups may include the element-array terminals in the number of F/A at the same positions of the basic terminal arrangement.

In the semiconductor chip, the element-array terminals in the number of F/A in each of the groups may include G first element-array terminals (G is a natural number) that are electrically coupled to each other. Each of the groups may include the first element-array terminals at the same positions of the basic terminal arrangement.

In the semiconductor chip, E may be a number other than a number divisible by the A. G may be a remainder that results from the division of the E by the A.

In the semiconductor chip, the element-array terminals in the number of F/A in each of the groups may include second element-array terminals that are electrically isolated from any other element-array terminals. Each of the groups may include the second element-array terminals at the same positions of the basic terminal arrangement.

A semiconductor chip according to another aspect of the present invention includes a semiconductor substrate and terminals of A groups (A is an integer equal to or larger than 2 (two)) formed on the semiconductor substrate. Each of the groups includes a plurality of terminals. The semiconductor chip also includes an integrated circuit formed on the semiconductor substrate. The plurality of terminals in each of the groups are arranged in accordance with predetermined basic terminal arrangement. Each of the groups is disposed at each of positions that are defined by rotating one of the positions around a point. The integrated circuit includes a converter. The converter includes B conversion input parts (B is an integer equal to or larger than 2 (two)) and has the function of selecting at least one signal among a group of predetermined output signals of the same kind in response to an input signal input to the conversion input parts. The terminals of the groups include C conversion terminals (C is an integer equal to or larger than 2 (two)) that are electrically coupled to the conversion input parts. Each of the conversion terminals is electrically coupled to one of the conversion input parts. Each of the groups includes the conversion terminals in the number of C/A at the same positions of the basic terminal arrangement. According to the present invention, the same semiconductor chips can be stacked.

In the semiconductor chip, the conversion terminals in the number of C/A in each of the groups may include D first conversion terminals (D is a natural number) that are electrically coupled to each other. Each of the groups may include the first conversion terminals at the same positions of the basic terminal arrangement.

In the semiconductor chip, B may be a number other than a number divisible by the A. D may be a remainder that results from the division of the B by the A.

In the semiconductor chip, the conversion terminals in the number of C/A in each of the groups may include second conversion terminals that are electrically isolated from any other conversion terminals. Each of the groups may include the second conversion terminals at the same positions of the basic terminal arrangement.

In the semiconductor chip, the integrated circuit may include an element array that has a plurality of elements having the same function, and E element-array input parts (E is an integer equal to or larger than 2 (two)) for each being electrically coupled to any of the elements. The terminals of the groups may include F element-array terminals (F is an integer equal to or larger than 2 (two)) that are electrically coupled to the element-array input parts. Each of the groups may include the element-array terminals in the number of F/A at the same positions of the basic terminal arrangement.

In the semiconductor chip, the element-array terminals in the number of F/A in each of the groups may include G first element-array terminals (G is a natural number) that are electrically coupled to each other. Each of the groups may include the first element-array terminals at the same positions of the basic terminal arrangement.

In the semiconductor chip, E may be a number other than a number divisible by the A. G may be a remainder that results from the division of the E by the A.

In the semiconductor chip, the element-array terminals in the number of F/A in each of the groups may include second element-array terminals that are electrically isolated from any other element-array terminals. Each of the groups may include the second element-array terminals at the same positions of the basic terminal arrangement.

A semiconductor chip according to another aspect of the present invention includes a semiconductor substrate and terminals of A groups (A is an integer equal to or larger than 2 (two)) formed on the semiconductor substrate. Each of the groups includes a plurality of terminals. The semiconductor chip also includes an integrated circuit formed on the semiconductor substrate. The plurality of terminals in each of the groups are arranged in accordance with predetermined basic terminal arrangement. Each of the groups is disposed at each of positions that are defined by rotating one of the positions around a point. The integrated circuit includes an element array that has a plurality of elements having the same function, and E element-array input parts (E is an integer equal to or larger than 2 (two)) for each being electrically coupled to any of the elements. The terminals of the groups include F element-array terminals (F is an integer equal to or larger than 2 (two)) that are electrically coupled to the element-array input parts. Each of the groups includes the element-array terminals in the number of F/A at the same positions of the basic terminal arrangement. According to the present invention, the same semiconductor chips can be stacked.

In the semiconductor chip, the element-array terminals in the number of F/A in each of the groups may include G first element-array terminals (G is a natural number) that are electrically coupled to each other. Each of the groups may include the first element-array terminals at the same positions of the basic terminal arrangement.

In the semiconductor chip, E may be a number other than a number divisible by the A. G may be a remainder that results from the division of the E by the A.

In the semiconductor chip, the element-array terminals in the number of F/A in each of the groups may include second element-array terminals that are electrically isolated from any other element-array terminals. Each of the groups may include the second element-array terminals at the same positions of the basic terminal arrangement.

In the semiconductor chip, the groups adjacent to each other may be disposed at positions that are defined by rotating one of the positions around a point by an angle of 360/A degrees.

In the semiconductor chip, a plurality of through-electrodes provided through the semiconductor substrate may be further included. The through-electrodes may be electrically coupled to the terminals of the groups.

A semiconductor device according to another aspect of the present invention includes a plurality of stacked semiconductor chips having the same structure, at least in design. Each of the semiconductor chips includes a semiconductor substrate and terminals of A groups (A is an integer equal to or larger than 2 (two)) formed on the semiconductor substrate. Each of the groups includes a plurality of terminals. Each of the semiconductor chips also includes an integrated circuit formed on the semiconductor substrate. The plurality of terminals in each of the groups is arranged in accordance with predetermined basic terminal arrangement. Each of the groups is disposed at each of positions that are defined by rotating one of the positions around a point. Each of the groups includes same-function terminals to achieve the same function at the same positions of the basic terminal arrangement. The plurality of semiconductor chips are disposed so that the point of each of the semiconductor chips coincides with each other and the terminals of the groups of top-to-bottom overlap each other. The terminals, which overlap, are electrically coupled to each other.

A semiconductor device according to another aspect of the present invention includes a plurality of stacked semiconductor chips having the same structure, at least in design. Each of the semiconductor chips includes a semiconductor substrate and terminals of A groups (A is an integer equal to or larger than 2 (two)) formed on the semiconductor substrate. Each of the groups includes a plurality of terminals. Each of the semiconductor chips also includes an integrated circuit formed on the semiconductor substrate. The plurality of terminals in each of the groups are arranged in accordance with predetermined basic terminal arrangement. Each of the groups is disposed at each of positions that are defined by rotating one of the positions around a point. Each of the groups includes a group of contact/non-contact terminals at a same positions group of the basic terminal arrangement. The group of contact/non-contact terminals includes a contact terminal that is electrically coupled to a same-function circuit and non-contact terminals that are electrically isolated from the same-function circuit. The contact terminal is disposed at a different position of the basic terminal arrangement for each of the groups. The plurality of semiconductor chips are disposed so that the point of each of the semiconductor chips coincides with each other and each of the semiconductor chips is rotated around the point by each of angles different from each other. Thereby the groups whose positions of the contact terminal in the basic terminal arrangement are different from each other, overlap. The terminals, which overlap, are electrically coupled to each other.

A semiconductor device according to another aspect of the present invention includes a plurality of stacked semiconductor chips having the same structure, at least in design. Each of the semiconductor chips includes a semiconductor substrate and terminals of A groups (A is an integer equal to or larger than 2 (two)) formed on the semiconductor substrate. Each of the groups includes a plurality of terminals. Each of the semiconductor chips also includes an integrated circuit formed on the semiconductor substrate. The plurality of terminals in each of the groups are arranged in accordance with predetermined basic terminal arrangement. Each of the groups is disposed at each of positions that are defined by rotating one of the positions around a point. The integrated circuit includes a converter. The converter includes B conversion input parts (B is an integer equal to or larger than 2 (two)) and has the function of selecting at least one signal among a group of predetermined output signals of the same kind in response to an input signal input to the conversion input parts. The terminals of the groups include C conversion terminals (C is an integer equal to or larger than 2 (two)) that are electrically coupled to the conversion input parts. Each of the conversion terminals is electrically coupled to one of the conversion input parts. Each of the groups includes the conversion terminals in the number of C/A at the same positions of the basic terminal arrangement. The plurality of semiconductor chips are disposed so that the point of each of the semiconductor chips coincides with each other and the terminals of the groups of top-to-bottom overlap each other. The terminals, which overlap, are electrically coupled to each other.

A semiconductor device according to another aspect of the present invention includes a plurality of stacked semiconductor chips having the same structure, at least in design. Each of the semiconductor chips includes a semiconductor substrate and terminals of A groups (A is an integer equal to or larger than 2 (two)) formed on the semiconductor substrate. Each of the groups includes a plurality of terminals. Each of the semiconductor chips also includes an integrated circuit formed on the semiconductor substrate. The plurality of terminals in each of the groups are arranged in accordance with predetermined basic terminal arrangement. Each of the groups is disposed at each of positions that are defined by rotating one of the positions around a point. The integrated circuit includes an element array that has a plurality of elements having the same function and E element-array input parts (E is an integer equal to or larger than 2 (two)) for each being electrically coupled to any of the elements.

The terminals of the groups include F element-array terminals (F is an integer equal to or larger than 2 (two)) that are electrically coupled to the element-array input parts. Each of the groups includes the element-array terminals in the number of F/A at the same positions of the basic terminal arrangement. The plurality of semiconductor chips are disposed so that the point of each of the semiconductor chips coincides with each other and the terminals of the groups of top-to-bottom overlap each other. The terminals, which overlap, are electrically coupled to each other.

A circuit board according to another aspect of the present invention includes the above-described semiconductor chip mounted thereon.

A circuit board according to another aspect of the present invention includes the above-described semiconductor device mounted thereon.

Electronic equipment according to another aspect of the present invention includes the above-described semiconductor chip.

Electronic equipment according to another aspect of the present invention includes the above-described semiconductor device.

A method of manufacturing a semiconductor device according to another aspect of the present invention includes aligning a plurality of semiconductor chips that have the same structure, at least in design, with each other and stacking the plurality of semiconductor chips. Each of the semiconductor chips includes a semiconductor substrate and terminals of A groups (A is an integer equal to or larger than 2 (two)) that are formed on the semiconductor substrate. Each of the groups includes a plurality of terminals. Each of the semiconductor chips also includes an integrated circuit that is formed on the semiconductor substrate. The plurality of terminals in each of the groups are arranged in accordance with predetermined basic terminal arrangement. Each of the groups is disposed at each of positions that are defined by rotating one of the positions around a point. Each of the groups includes same-function terminals to achieve the same function at the same positions of the basic terminal arrangement. The plurality of semiconductor chips are disposed so that the point of each of the semiconductor chips coincides with each other and the terminals of the groups of top-to-bottom overlap each other, in the aligning. According to the present invention, the same semiconductor chips can be stacked.

A method of manufacturing a semiconductor device according to another aspect of the present invention includes aligning a plurality of semiconductor chips that have the same structure, at least in design, with each other and stacking the plurality of semiconductor chips. Each of the semiconductor chips includes a semiconductor substrate and terminals of A groups (A is an integer equal to or larger than 2 (two)) that are formed on the semiconductor substrate. Each of the groups includes a plurality of terminals. Each of the semiconductor chips also includes an integrated circuit that is formed on the semiconductor substrate. The plurality of terminals in each of the groups are arranged in accordance with predetermined basic terminal arrangement. Each of the groups is disposed at each of positions that are defined by rotating one of the positions around a point. Each of the groups includes a group of contact/non-contact terminals at a same positions group of the basic terminal arrangement. The group of contact/non-contact terminals includes a contact terminal that is electrically coupled to a same-function circuit and non-contact terminals that are electrically isolated from the same-function circuit. The contact terminal is disposed at a different position of the basic terminal arrangement for each of the groups. The plurality of semiconductor chips are disposed so that the point of each of the semiconductor chips coincides with each other and each of the semiconductor chips is rotated around the point by each of angles different from each other and thereby the groups whose positions of the contact terminal in the basic terminal arrangement are different from each other overlap, in the aligning. According to the present invention, the same semiconductor chips can be stacked.

A method of manufacturing a semiconductor device according to another aspect of the present invention includes aligning a plurality of semiconductor chips that have the same structure, at least in design, with each other and stacking the plurality of semiconductor chips. Each of the semiconductor chips includes a semiconductor substrate and terminals of A groups (A is an integer equal to or larger than 2 (two)) that are formed on the semiconductor substrate. Each of the groups includes a plurality of terminals. Each of the semiconductor chips also includes an integrated circuit that is formed on the semiconductor substrate. The plurality of terminals in each of the groups are arranged in accordance with predetermined basic terminal arrangement. Each of the groups is disposed at each of positions that are defined by rotating one of the positions around a point. The integrated circuit includes a converter. The converter includes B conversion input parts (B is an integer equal to or larger than 2 (two)) and has the function of selecting at least one signal among a group of predetermined output signals of the same kind in response to an input signal input to the conversion input parts. The terminals of the groups include C conversion terminals (C is an integer equal to or larger than 2 (two)) that are electrically coupled to the conversion input parts. Each of the conversion terminals is electrically coupled to one of the conversion input parts. Each of the groups includes the conversion terminals in the number of C/A at the same positions of the basic terminal arrangement. The plurality of semiconductor chips are disposed so that the point of each of the semiconductor chips coincides with each other and the terminals of the groups of top-to-bottom overlap each other, in the aligning. According to the present invention, the same semiconductor chips can be stacked.

A method of manufacturing a semiconductor device according to another aspect of the present invention includes aligning a plurality of semiconductor chips that have the same structure, at least in design, with each other and stacking the plurality of semiconductor chips. Each of the semiconductor chips includes a semiconductor substrate and terminals of A groups (A is an integer equal to or larger than 2 (two)) that are formed on the semiconductor substrate. Each of the groups includes a plurality of terminals. Each of the semiconductor chips also includes an integrated circuit that is formed on the semiconductor substrate. The plurality of terminals in each of the groups are arranged in accordance with predetermined basic terminal arrangement. Each of the groups is disposed at each of positions that are defined by rotating one of the positions around a point. The integrated circuit includes an element array that has a plurality of elements having the same function and E element-array input parts (E is an integer equal to or larger than 2 (two)) for each being electrically coupled to any of the elements. The terminals of the groups include F element-array terminals (F is an integer equal to or larger than 2 (two)) that are electrically coupled to the element-array input parts. Each of the groups includes the element-array terminals in the number of F/A at the same positions of the basic terminal arrangement. The plurality of semiconductor chips are disposed so that the point of each of the semiconductor chips coincides with each other and the terminals of the groups of top-to-bottom overlap each other, in the aligning. According to the present invention, the same semiconductor chips can be stacked.

DETAILED DESCRIPTION OF EXEMPLARY EMBODIMENTS

Embodiments of the present invention will be described below with reference to accompanying drawings.

First Exemplary Embodiment

Figure 1:
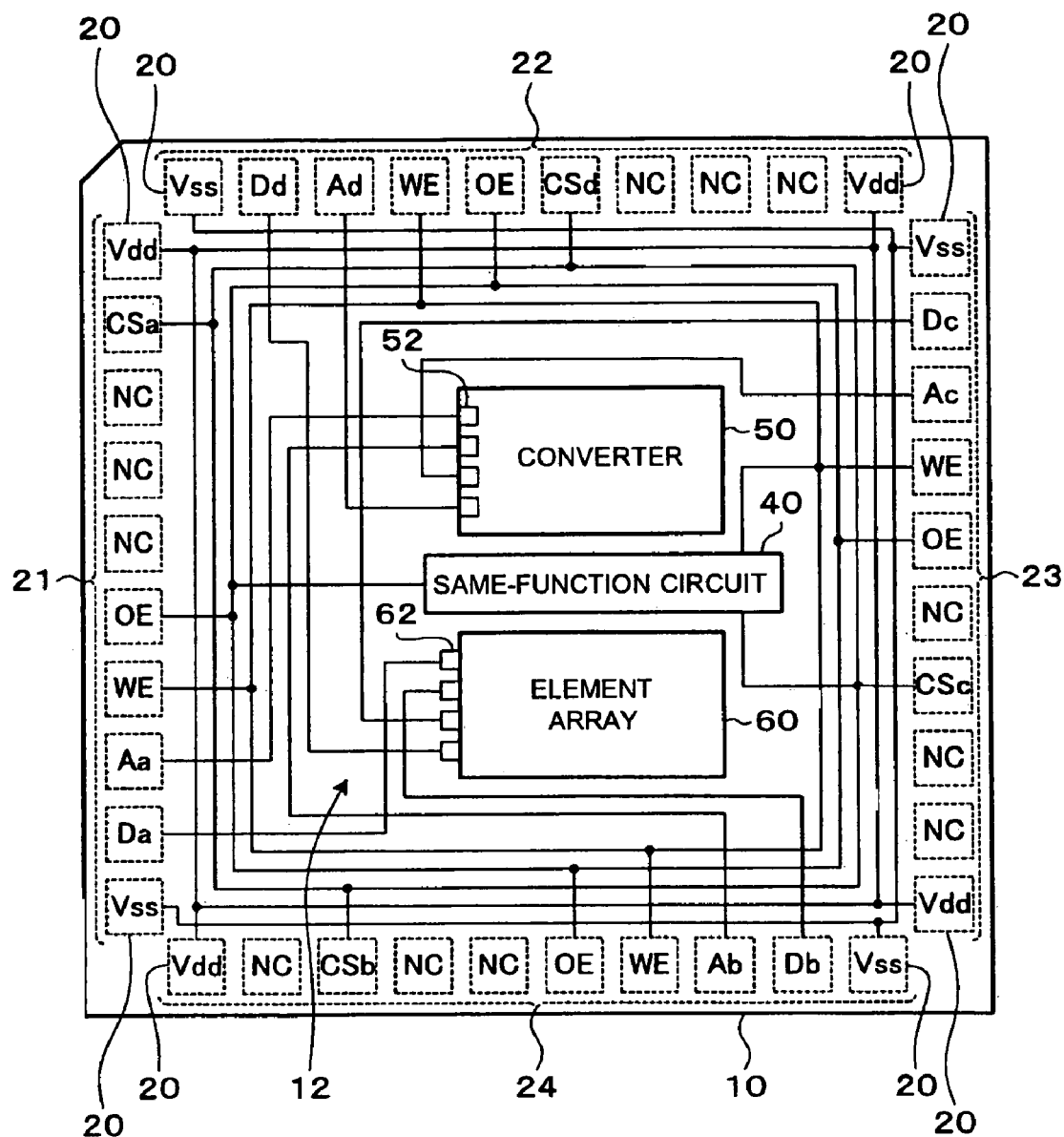
FIG. 1 is a schematic for explaining a semiconductor chip according to a first exemplary embodiment of the present invention.

FIG. 1 is a schematic for explaining a semiconductor chip according to a first exemplary embodiment of the present invention. The semiconductor chip includes a semiconductor substrate 10. Here, the upper left corner of the semiconductor substrate 10 is cut off in FIG. 1. This is for easier comprehension of rotational positions described later and need not be applied to actual products.

An integrated circuit 12 is provided to the semiconductor substrate 10. In the exemplary embodiment, the integrated circuit 12 includes a circuit achieving the function of an SRAM (Static Random Access Memory). The present invention can be also applied to a semiconductor chip that includes a circuit achieving the function of a memory other than an SRAM (a RAM (Random Access Memory), such as a DRAM (Dynamic Random Access Memory) and a ROM (Read Only Memory)) or a logic LSI.

Terminals 20 of A groups (A is an integer equal to or larger than 2 (two)) are formed on the semiconductor substrate 10. In an example shown in FIG. 1, the terminals 20 of 4 (four) groups 21 through 24 are formed. A plurality (for example, 10 (ten)) of terminals 20 is included in each of the groups 21 through 24.

Figure 2:
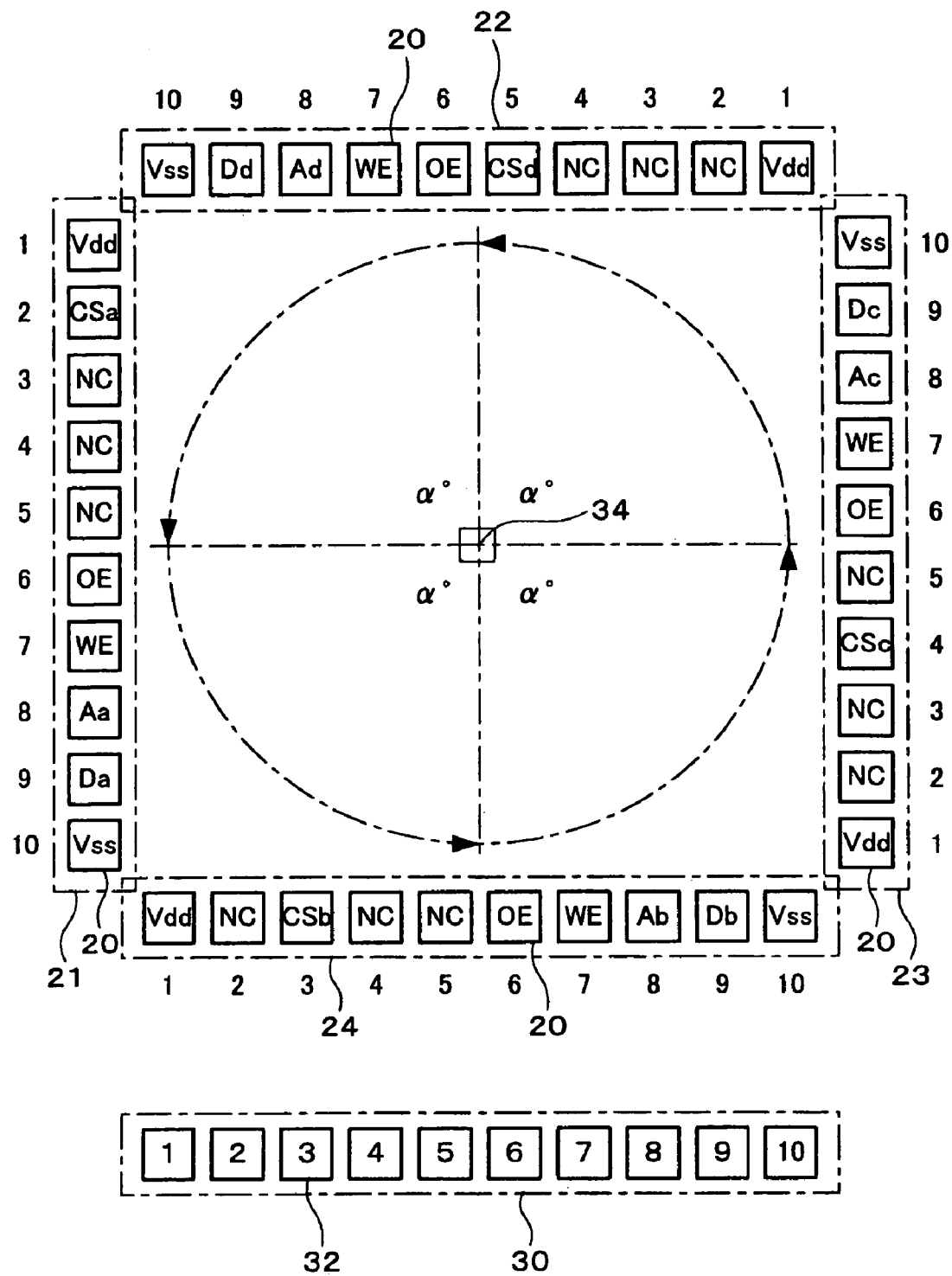
FIG. 2 is a schematic for explaining the semiconductor chip according to the first exemplary embodiment of the present invention.

FIG. 2 is a schematic for explaining the arrangement of the terminals. The plurality of terminals 20 in each of the groups 21 through 24 is arranged in accordance with predetermined basic terminal arrangement 30. Although the basic terminal arrangement 30 shown in FIG. 2 is an arrangement where basic terminals 32 are arranged in one row, the basic terminals 32 may be arranged in a plurality of rows or may be arranged in a plurality of rows and columns. Furthermore, the basic terminals 32 may be arranged along a curved line. Otherwise, arrangements other than the above-described arrangement is also available. The A (for example, A=4 (four)) groups 21 through 24 are each disposed at each of positions that are defined by rotating one of the positions around a point 34. Rotational angle α between the adjacent groups may be the same. In this case, α=360/A degrees. Specifically, the adjacent groups may be disposed at positions that are defined by rotating one of the positions by an angle of 360/A degrees. A semiconductor chip according to the exemplary embodiment is a peripheral type. The plurality of terminals 20 of each of the groups 21 through 24 is arranged along each side of the semiconductor substrate 10, which is rectangular.

Each of the groups 21 through 24 includes same-function terminals to achieve the same function at the same positions of the basic terminal arrangement 30. As the same-function terminal, each of the groups 21 through 24 includes one of terminals Vdd at the position of number 1 (one) of the basic terminal arrangement 30 shown in FIG. 2. The terminals Vdd are features to achieve the function of supplying power (voltage Vdd) to the integrated circuit 12. Each of the terminals Vdd of the groups 21 through 24 is electrically coupled to the integrated circuit 12 through a protection circuit, for example. The terminals Vdd of the A groups (for example, all of the groups) may be electrically coupled to each other.

As the same-function terminal, each of the groups 21 through 24 includes one of terminals Vss at the position of number 10 (ten) of the basic terminal arrangement 30 shown in FIG. 2. The terminals Vss are features to achieve the function of supplying power (voltage Vss (for example, GND)) to the integrated circuit 12. Each of the terminals Vss of the groups 21 through 24 is electrically coupled to the integrated circuit 12 through a protection circuit, for example. The terminals Vss of the A groups (for example, all of the groups) may be electrically coupled to each other.

As the same-function terminal, each of the groups 21 through 24 includes one of terminals OE at the position of number 6 (six) of the basic terminal arrangement 30 shown in FIG. 2. The terminals OE are features to achieve the function of enabling data to be output. The terminals OE of the A groups (for example, all of the groups) may be electrically coupled to the same circuit. Specifically, each of the terminals OE of the groups 21 through 24 may be electrically coupled to a same-function circuit (a control circuit (for example, an input/output-control circuit or a reading/writing-control circuit)) 40 shown in FIG. 1 through a buffer, for example. An output enabling signal is input to the terminals OE. The terminals OE of the A groups (for example, all of the groups) may be electrically coupled to each other.

As the same-function terminal, each of the groups 21 through 24 includes one of terminals WE at the position of number 7 (seven) of the basic terminal arrangement 30 shown in FIG. 2. The terminals WE are features to achieve the function of enabling data to be written. The terminals WE of the A groups (for example, all of the groups) may be electrically coupled to the same circuit. Namely, each of the terminals WE of the groups 21 through 24 may be electrically coupled to the same-function circuit (a control circuit (for example, an input/output-control circuit or a reading/writing-control circuit)) 40 shown in FIG. 1 through a buffer, for example. A writing enabling signal is input to the terminals WE. The terminals WE of the A groups (for example, all of the groups) may be electrically coupled to each other. The same-function circuit 40 electrically coupled to the terminals OE and the same-function circuit 40 electrically coupled to the terminals WE may be the same.

Figure 3:
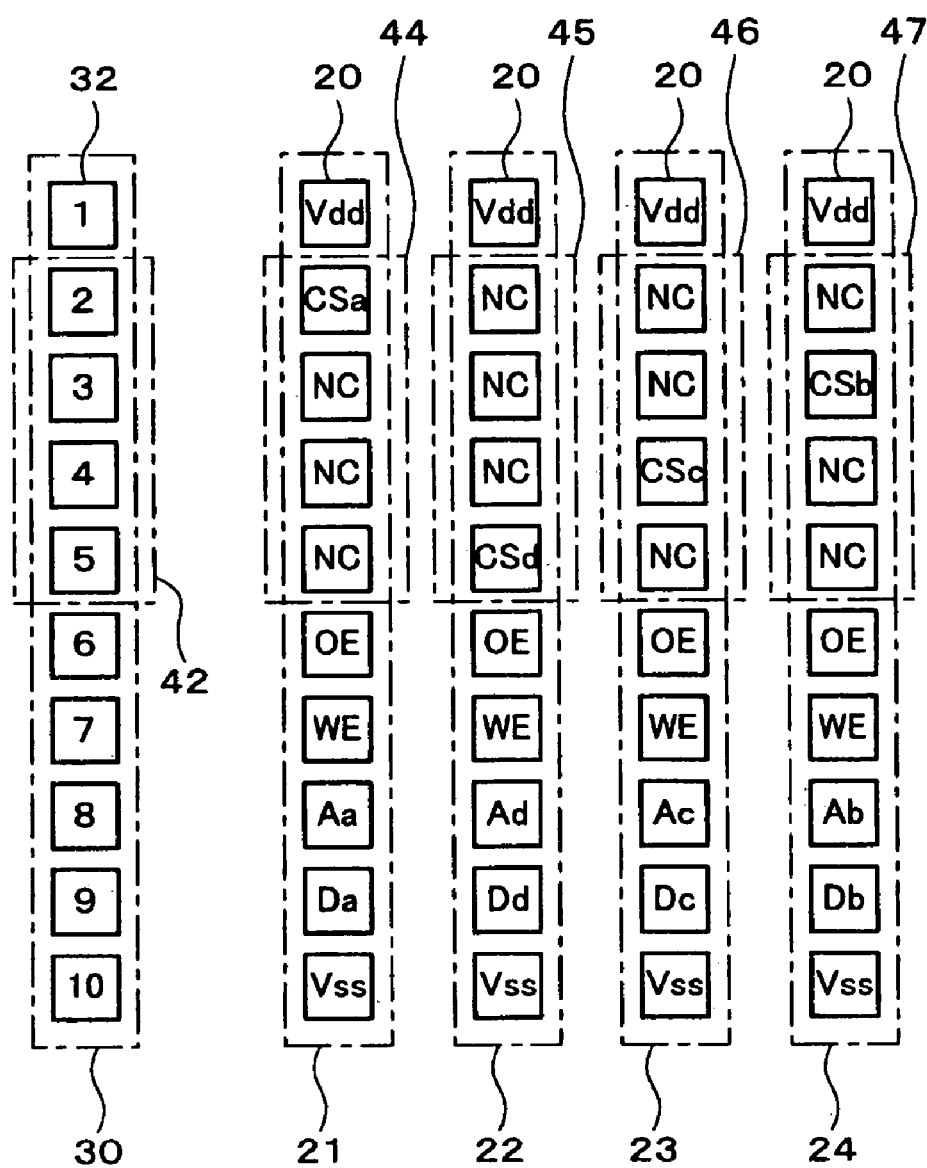
FIG. 3 is a schematic for explaining the semiconductor chip according to the first exemplary embodiment of the present invention.

FIG. 3 is a schematic showing the terminals of the A groups that are re-arranged so as to correspond to the basic terminal arrangement. Each of the groups 21 through 24 includes a group of contact/non-contact terminals 44 (45, 46 or 47) at a same positions group (a group of positions of number 2 (two) through 5 (five), in FIG. 3) 42 of the basic terminal arrangement 30. The group of contact/non-contact terminals 44 (45, 46, or 47) includes a contact terminal CSa (CSb, CSc, or CSd) that is electrically coupled to the same-function circuit 40 and non-contact terminals NC that are not electrically coupled to the same-function circuit 40, as shown in FIG. 1. In the present exemplary embodiment, the contact terminal CSa (CSb, CSc, or CSd) is a chip-selecting terminal and the internal circuit is switched "off" when a chip-selecting signal is not input to the contact terminal CSa (CSb, CSc, or CSd) (a non-selected period). The same-function circuit 40 may include a chip-selecting circuit.

The contact terminal CSa (CSb, CSc, or CSd) is disposed at a different position of the basic terminal arrangement 30 for each of the groups 21 through 24. For example, the contact terminal CSa is disposed at the position of number 2 (two) of the basic terminal arrangement 30 in the first group 21, while the contact terminal CSd is disposed at the position of number 5 (five) of the basic terminal arrangement 30 in the second group 22. In addition, the contact terminal CSc is disposed at the position of number 4 (four) of the basic terminal arrangement 30 in the third group 23, while the contact terminal CSb is disposed at the position of number 3 (three) of the basic terminal arrangement 30 in the fourth group 24.

The contact terminal CSa (CSb, CSc, or CSd) of each of the groups 21 through 24 may be electrically coupled to each other, as shown in FIG. 1. The number of terminals (4 (four), in the example shown in FIG. 3) of the group of contact/non-contact terminals 44 (45, 46, or 47) may be equal to or larger than the number of groups (A, in the exemplary embodiment). The non-contact terminals NC may not be electrically coupled to the integrated circuit 12.

The integrated circuit 12 may include a converter (for example, a decoder) 50 as shown in FIG. 1. The converter 50 includes B (4 (four), in FIG. 1) conversion input parts 52 (B is an integer equal to or larger than 2 (two)). The converter 50 has the function of selecting at least one signal among a group of predetermined output signals (for example, internal address signals) of the same kind in response to an input signal (for example, an address signal) input to the conversion input parts 52.

The terminals 20 of the A groups 21 through 24 may include C (4 (four), in FIG. 1) conversion terminals Aa, Ab, Ac, and Ad (C is an integer equal to or larger than 2 (two)) that are electrically coupled to the conversion input parts 52. Each of the conversion terminals Aa, Ab, Ac, and Ad is electrically coupled to one of the B conversion input parts 52. As shown in FIG. 3, each of the groups 21 through 24 may include the C/A (for example, 4/4=1) conversion terminals Aa (Ab, Ac, or Ad) at the same positions of the basic terminal arrangement 30 (the position of number 8 (eight), in FIG. 3). In the present exemplary embodiment, the C/A (for example, 1) conversion terminals Aa (Ab, Ac, or Ad) in each of the groups 21 through 24 may not be electrically coupled to any other conversion terminals.

As shown in FIG. 1, the integrated circuit 12 may include an element array (for example, a memory cell array) 60 that includes a plurality of elements (for example, memory cells) having the same function. The integrated circuit 12 may include E (4 (four), in FIG. 1) element-array input parts 62 (E is an integer equal to or larger than 2 (two)) for each being electrically coupled to any element (for example, memory cell). The terminals 20 of the A groups 21 through 24 may include F (4 (four), in FIG. 1) element-array terminals (for example, data terminals) Da, Db, Dc, and Dd (F is an integer equal to or larger than 2 (two)) that are electrically coupled to the element-array input parts 62. As shown in FIG. 3, each of the groups 21 through 24 may include the F/A (for example, 4/4=1) element-array terminals Da (Db, Dc, or Dd) at the same positions of the basic terminal arrangement 30 (the position of number 9 (nine), in FIG. 3).

Figure 4:
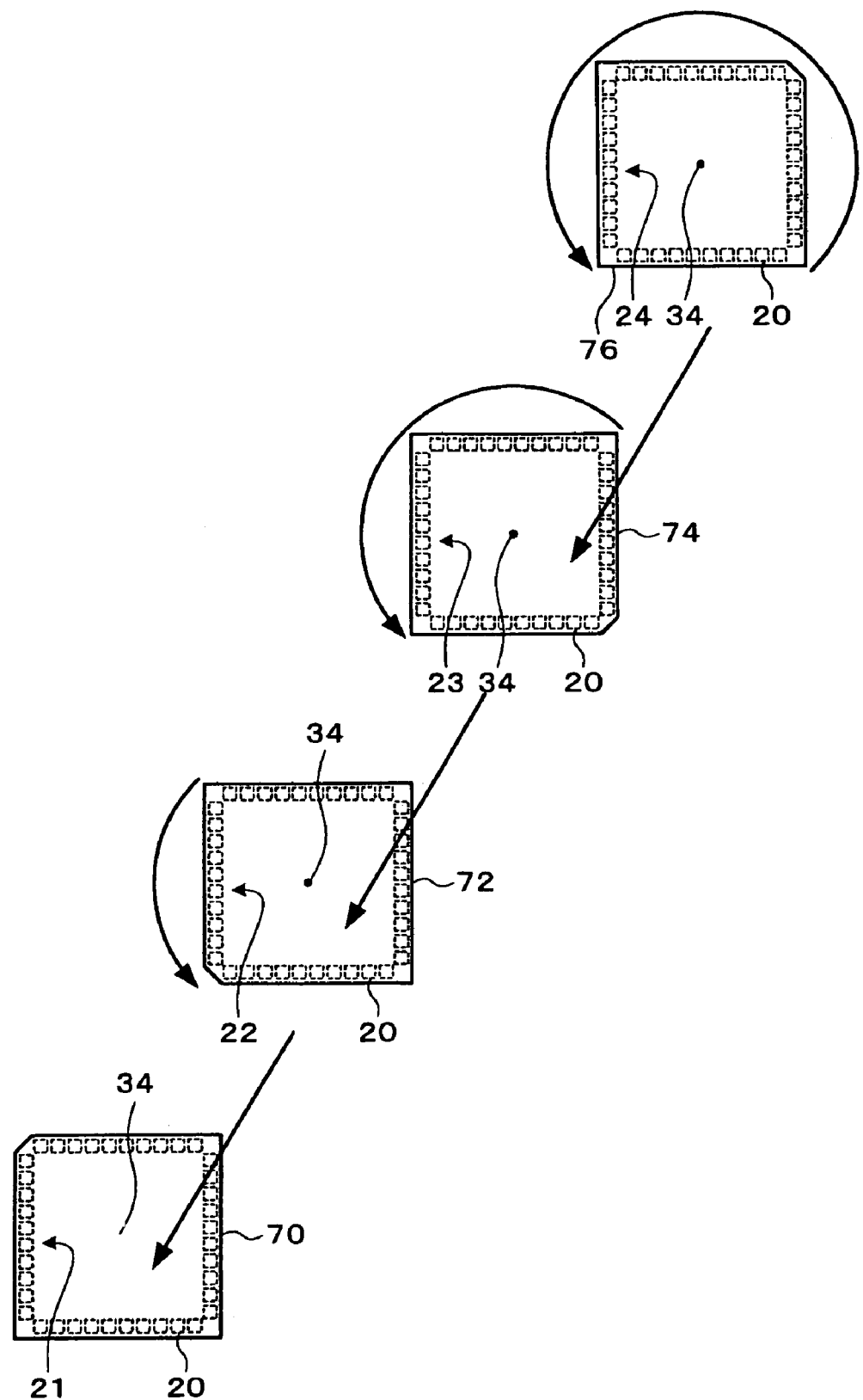
FIG. 4 is a schematic for explaining a method of manufacturing a semiconductor device according to the first exemplary embodiment of the present invention.

FIG. 4 is a schematic for explaining a method of manufacturing a semiconductor device according to the first exemplary embodiment of the present invention. In the exemplary embodiment, semiconductor chips 70, 72, 74, and 76 are used. The semiconductor chips 70, 72, 74, and 76 include the same content as that of the above-described semiconductor chip. The semiconductor chips 70, 72, 74, and 76 have the same structure, at least in design. The integrated circuit 12 of the semiconductor chips 70, 72, 74, and 76 may have the same structure, at least in design. The semiconductor chips 70, 72, and 74 include through-electrodes 26 (refer to FIG. 5) that are electrically coupled to the terminals 20. The through-electrodes 26 are provided through the semiconductor substrate 10 so that electrical coupling at the both side of the substrate is enabled. The semiconductor chip 76, which is stacked on top of the chips at the opposite side to the terminals 20, may not have the through-electrodes 26.

In the present exemplary embodiment, the semiconductor chips 70, 72, 74 and 76 are aligned with each other so as to be stacked. In the alignment, the semiconductor chips 70, 72, 74, and 76 are disposed so that the point 34 of each of the semiconductor chips coincides with each other and the terminals 20 of the A groups 21 through 24 of top-to-bottom overlap each other. In the alignment, the semiconductor chips 70, 72, 74, and 76 are disposed so that they each are rotated around the point 34 by each of angles different from each other. In the example shown in FIG. 3, the semiconductor chip 72 is disposed rotated by 90 degrees with respect to the semiconductor chip 70, the semiconductor chip 74 is disposed rotated by 180 degrees and the semiconductor chip 76 is disposed rotated by 270 degrees. This allows the groups whose positions of the contact terminal CSa (CSb, CSc, or CSd) are different from each other in the basic terminal arrangement 30 to be overlapped. In the example shown in FIG. 4, the first group 21 of the semiconductor 70, the second group 22 of the semiconductor chip 72, the third group 23 of the semiconductor chip 74, and the fourth group 24 of the semiconductor chip 76, overlap each other. According to the present exemplary embodiment, a semiconductor device can be obtained by stacking the same semiconductor chips.

Figure 5:
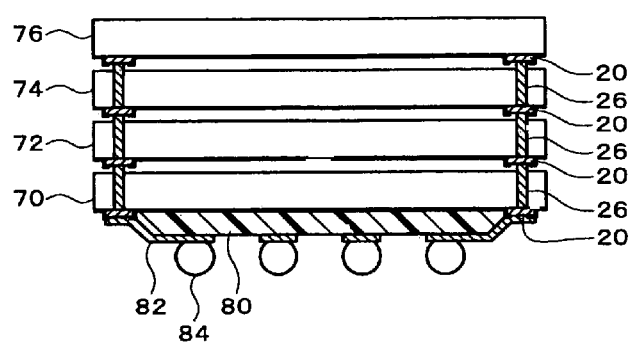
FIG. 5 is a schematic for explaining a semiconductor device according to the first exemplary embodiment of the present invention.

FIG. 5 is a schematic for explaining a semiconductor device according to the first exemplary embodiment of the present invention. The semiconductor device has a structure that is derived from the above-described manufacturing method. The terminals 20 and the through-electrodes 26 of the top-to-bottom semiconductor chips are electrically coupled (for example, bonded). Resin may be provided between the top-to-bottom semiconductor chips. Moreover, a resin layer 80 is formed on the semiconductor chip 70, which is lowest of the chips, at a side of the terminals 20. A wiring layer 82 is formed from above the terminals 20 to above the resin layer 80. External terminals 84 are formed above the wiring layer 82. The external terminals 84 may be formed from solder material. Solder material is metal (for example, alloy) having electrical conductivity and is material melted for electrical coupling. Solder material may be soft solder or may be hard solder. Solder not including lead (Pb) (it is referred to as Pb-free solder) may be used as solder material. As Pb-free solder, alloy of tin-silver (Sn—Ag) based, tin-bismuth (Sn—Bi) based, tin-zinc (Sn—Zn) based, or tin-cupper (Sn—Cu) based may be used. In addition, at least one of Ag, Bi, Zn, and Cu may be added to the alloy.

Figure 6:
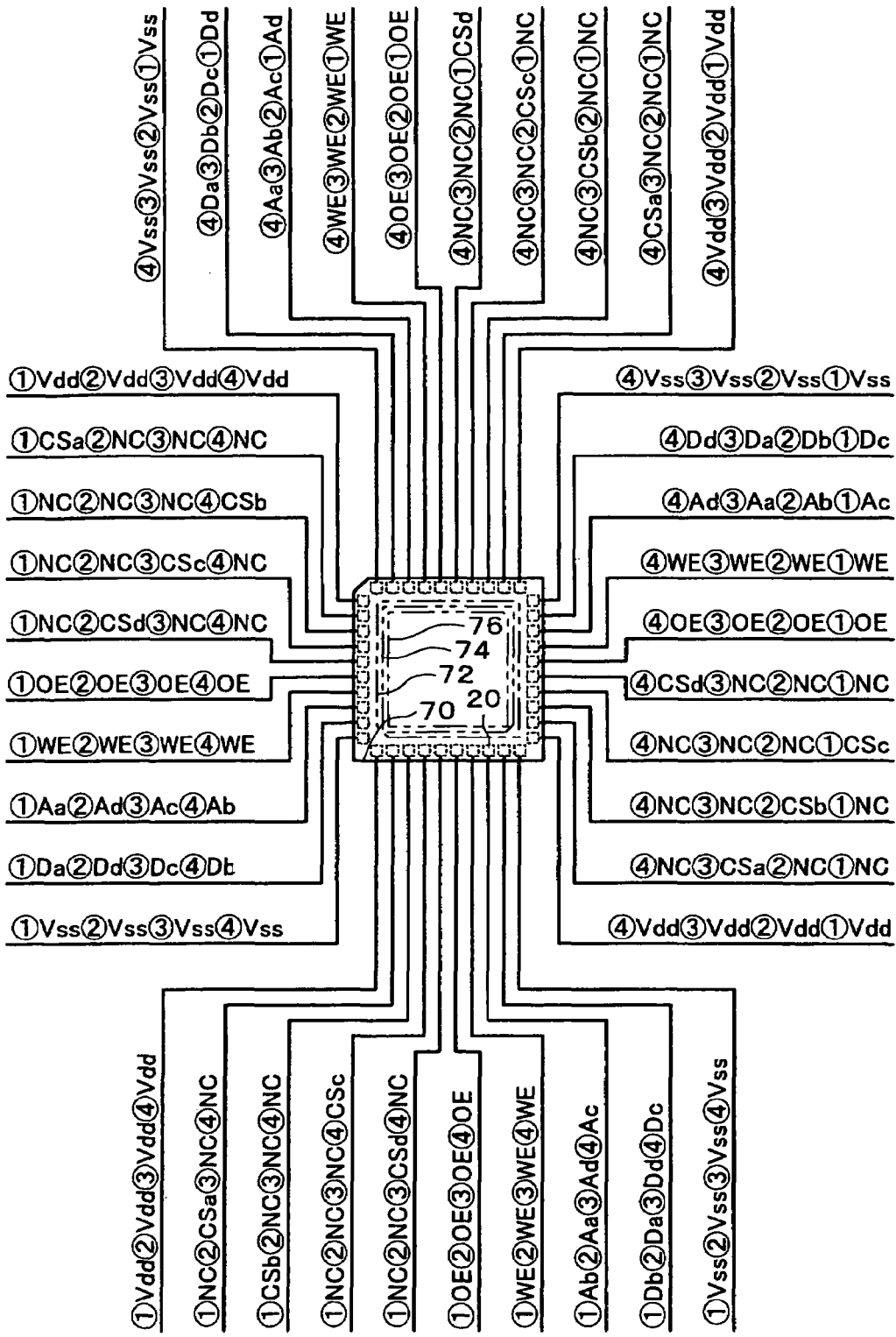
FIG. 6 is a schematic for explaining the semiconductor device according to the first exemplary embodiment of the present invention.

FIG. 6 is a schematic for explaining a semiconductor device according to the first exemplary embodiment of the present invention. In FIG. 6, the overlapped terminals 20 of the stacked semiconductor chips 70, 72, 74, and 76 are described. The circled number 1 (one) indicates the terminals 20 of the semiconductor chip 70, which is at a first level from the bottom, while the circled number 2 (two) indicates the terminals 20 of the semiconductor chip 72 at a second level from the bottom. In addition, the circled number 3 (three) indicates the terminals 20 of the semiconductor chip 74 at a third level from the bottom, while the circled number 4 (four) indicates the terminals 20 of the semiconductor chip 76 at a fourth level from the bottom.

In the stacked semiconductor chips 70, 72, 74, and 76, each of the terminals Vdd, the terminals OE, the terminals WE, and the terminals Vss, of the groups overlap (are electrically coupled to) each other. All of the terminals Vdd, OE, WE, and Vss are the same-function terminals.

The contact terminal CSa (CSb, CSc, or CSd) of any one of the semiconductor chips overlaps (is electrically coupled to) the non-contact terminals NC of other semiconductor chips. Specifically, the contact terminal CSa (CSb, CSc, and CSd) is prevented from overlapping (being electrically coupled to) the other contact terminal CSa (CSb, CSc, and CSd).

In the stacked semiconductor chips 70, 72, 74, and 76, the conversion terminals Aa, Ab, Ac, and Ad, which are electrically coupled to the conversion input parts 52 different for each of the conversion terminals, overlap (are electrically coupled to) each other. Thus, the same conversion terminals Aa (Ab, Ac, or Ad), which are electrically coupled to the same conversion input parts 52, are prevented from overlapping (being electrically coupled to) each other.

In the stacked semiconductor chips 70, 72, 74, and 76, the element-array terminals Da, Db, Dc, and Dd, which are electrically coupled to the element-array input parts 62 different for each of the element-array terminals, overlap (are electrically coupled to) each other. Thus, the same element-array terminals Da (Db, Dc, or Dd), which are electrically coupled to the same element-array input parts 62, are prevented from overlapping (being electrically coupled to) each other.

Figure 7:
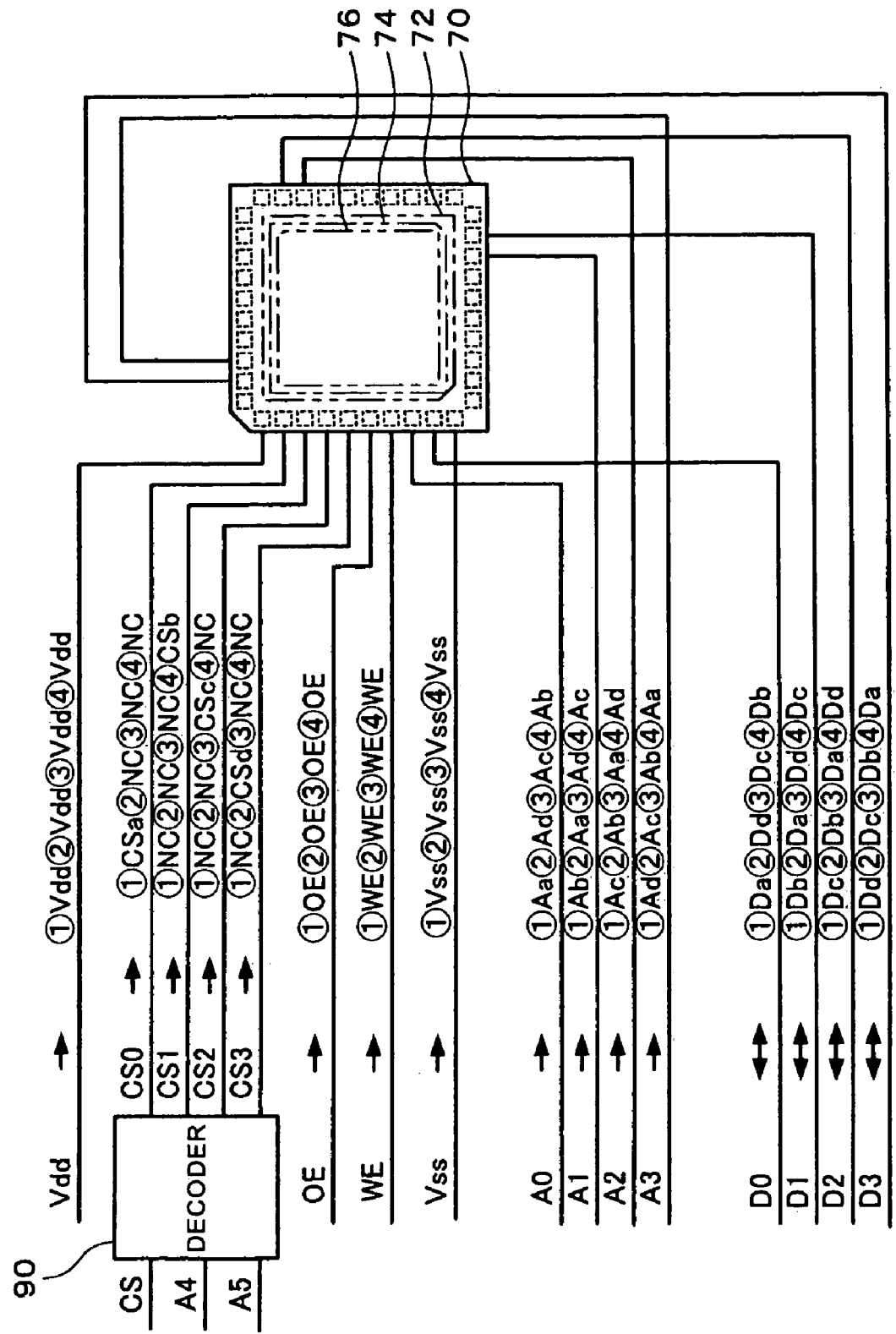
FIG. 7 is a schematic for explaining the operation of the semiconductor device according to the first exemplary embodiment of the present invention.

FIG. 7 is a schematic for explaining the operation of a semiconductor device according to the first exemplary embodiment of the present invention. Voltage Vdd is applied to the terminals Vdd, and voltage Vss is applied to the terminals Vss. In the exemplary embodiment, all of the terminals Vdd are electrically coupled to each other and all of the terminals Vss are electrically coupled to each other in the semiconductor chips 70, 72, 74, and 76. The voltage Vdd therefore is applied to any one of the terminals Vdd, and the voltage Vss is applied to any one of the terminals Vss.

A selecting signal CS indicating that the corresponding semiconductor device is selected and address signals A4 and A5 that indicate one chip is selected among the semiconductor chips 70, 72, 74, and 76, are input to a decoder 90 so as to produce chip-selecting signals CS0 through CS3. For example, when the semiconductor chip 70 is selected, the chip-selecting signal CS0 is input to the contact terminal CSa of the semiconductor chip 70 so that the semiconductor chip 70 becomes enabled. At this time, the chip-selecting signal CS0 is input to the non-contact terminals NC of other semiconductor chips 72, 74, and 76. These semiconductor chips therefore do not operate.

When data is written, the writing enabling signal WE is input to the terminals WE. In the exemplary embodiment, all of the terminals WE are electrically coupled to each other in the semiconductor chips 70, 72, 74, and 76. The writing enabling signal WE therefore is input to any one of the terminals WE.

Then, code signals (for example, address signals) A0 through A3 are input to the conversion terminals (for example, address terminals) Aa, Ab, Ac, and Ad. The code signals A0 through A3 are converted into at least one (for example, 1 (one)) internal code signal (for example, internal address signal) of a group of predetermined output signals of the same kind, by the converter 50 (refer to FIG. 1). One group of the element array (for example, memory cell array) 60 is specified by the internal code signal.

In the present exemplary embodiment, the semiconductor chips 70, 72, 74, and 76 are disposed so that the groups 21 through 24 are different from each other (the conversion terminals Aa, Ab, Ac, and Ad are different from each other) overlap each other. For example, the conversion terminals Aa of the semiconductor chip 70 at a first level, the conversion terminals Ad of the semiconductor chip 72 at a second level, the conversion terminals Ac of the semiconductor chip 74 at a third level, and the conversion terminals Ab of the semiconductor chip 76 at a fourth level, overlap each other.

For example, when the semiconductor chip 70 is selected, the code signals A0, A1, A2, and A3 are input to the conversion terminals Aa, Ab, Ac, and Ad of the semiconductor chip 70, respectively. When the semiconductor chip 72 is selected, the code signals A0, A1, A2, and A3 are input to the conversion terminals Ad, Aa, Ab, and Ac of the semiconductor chip 72, respectively. Specifically, the code signals A0, A1, A2, and A3 input to the semiconductor chip 70 are input to the semiconductor chip 72 as the code signals A1, A2, A3, and A0, respectively. Thus, the different code signals are input depending on the selected semiconductor chip. Although the internal code signal converted by the converter 50 also varies depending on the selected semiconductor chip, the internal code signal is at least one (for example, 1 (one)) signal of a group of predetermined output signals of the same kind, the operation therefore is normal since the output signal is the same kind. For example, in the case of a memory, different address of a memory cell is specified merely.

Then, data signals D0 through D3 are input to the element-array terminals (for example, data terminals) Da, Db, Dc, and Dd. The data signals D0 through D3 are input to the element array (for example, memory cell array) 60 shown in FIG. 1. For example, the data signals D0 through D3 are input to one group elements of the element array 60. This group is specified by the above-described internal code signal. Here, although the elements of the different group are specified depending on the selected semiconductor chip, the operation is normal since the elements constituting the element array 60 have the same function.

In the present exemplary embodiment, the semiconductor chips 70, 72, 74, and 76 are disposed so that the groups 21 through 24 are different from each other (the element-array terminals Da, Db, Dc, and Dd are different from each other) overlap each other. For example, the element-array terminals Da of the semiconductor chip 70 at a first level, the element-array terminals Dd of the semiconductor chip 72 at a second level, the element-array terminals Dc of the semiconductor chip 74 at a third level and the element-array terminals Db of the semiconductor chip 76 at a fourth level, overlap each other.

For example, when the semiconductor chip 70 is selected, the data signals D0, D1, D2, and D3 are input to the element-array terminals Da, Db, Dc, and Dd of the semiconductor chip 70, respectively. When the semiconductor chip 72 is selected, the data signals D0, D1, D2, and D3 are input to the element-array terminals Dd, Da, Db, and Dc of the semiconductor chip 72, respectively. Specifically, the data signals D0, D1, D2, and D3 input to the semiconductor chip 70 are input to the semiconductor chip 72 as the data signals D1, D2, D3, and D0, respectively. Thus, the different data signals are input depending on the selected semiconductor chip.

When data is read out, an output enabling signal OE is input to the terminals OE. In the exemplary embodiment, all of the terminals OE are electrically coupled to each other in the semiconductor chips 70, 72, 74, and 76. The output enabling signal OE therefore is input to any one of the terminals OE. Details about the input of the code signals A0 through A3 and the output of the data signals D0 through D3 are omitted since the details can be derived from the above-described explanation about writing data.

Second Exemplary Embodiment

Figure 8:
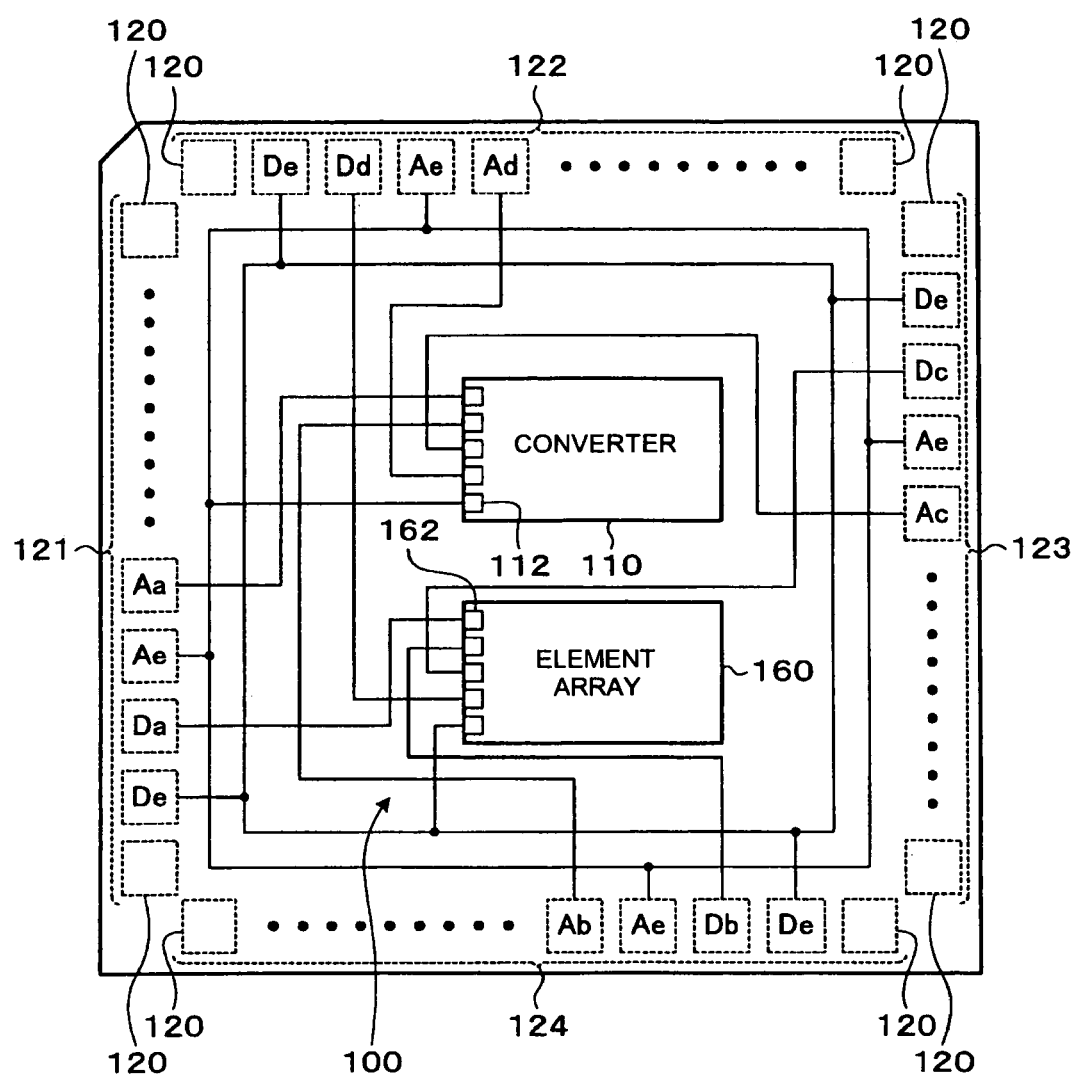
FIG. 8 is a schematic for explaining a semiconductor chip according to a second exemplary embodiment of the present invention.
Figure 9:
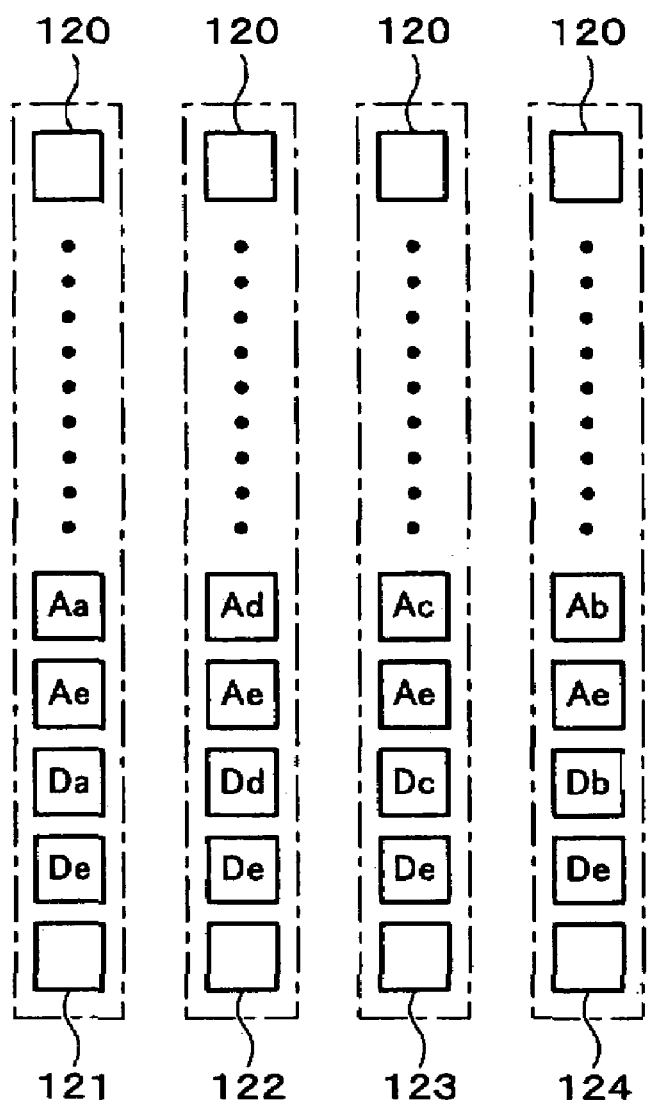
FIG. 9 is a schematic for explaining the semiconductor chip according to the second exemplary embodiment of the present invention.

FIG. 8 is a schematic for explaining a semiconductor chip according to a second exemplary embodiment where the present invention is applied. FIG. 9 is a schematic for explaining the terminals of the A groups that are re-arranged so as to correspond to the basic terminal arrangement.

An integrated circuit 100 includes a converter 110. The converter 110 includes B (for example, 5 (four)) conversion input parts 112 (B is an integer equal to or larger than 2 (two)). B (for example, 5 (five)) is a number that is not divisible by A (the number of groups of terminals).

Terminals 120 of A (for example, 4 (four)) groups 121 through 124 include the C (for example, 8 (eight)) conversion terminals Aa through Ae (C is an integer equal to or larger than 2 (two)) that are electrically coupled to the conversion input parts 112. Each of the conversion terminals Aa through Ae is electrically coupled to one of the B (for example, 5 (five)) conversion input parts 112. Each of the groups 121 through 124 includes the C/A (for example, 8/4=2 (two)) conversion terminals Aa through Ae at the same positions of the basic terminal arrangement (refer to FIG. 9).

Each of the groups 121 through 124 includes the D (for example, 1 (one)) first conversion terminals Ae (refer to FIG. 8) (D is a natural number) that are electrically coupled to each other. Each of the groups 121 through 124 includes the first conversion terminals Ae at the same positions of the basic terminal arrangement (refer to FIG. 9). D (for example, 1 (one)) is a reminder that results from the division of B (for example, 5 (five)) by A (for example, 4 (four)). Each of the groups 121 through 124 includes the second conversion terminals Aa (Ab, Ac, or Ad) that are not electrically coupled to any other conversion terminals Aa through Ae (refer to FIG. 8). Each of the groups 121 through 124 includes the second conversion terminals Aa (Ab, Ac, or Ad) at the same positions of the basic terminal arrangement (refer to FIG. 9).

The integrated circuit 100 includes an element array 160 that includes a plurality of elements having the same function. The integrated circuit 100 includes E (for example, 5 (five)) element-array input parts 162 (E is an integer equal to or larger than 2 (two)) for each being electrically coupled to any element. E (for example, 5 (five)) is a number that is not divisible by A (for example, 4 (four)).

The terminals 120 of the A (for example, 4 (four)) groups 121 through 124 include the F (for example, 8 (eight)) element-array terminals Da through De (F is an integer equal to or larger than 2 (two)) that are electrically coupled to the element-array input parts 162. Each of the groups 121 through 124 includes the F/A (for example, 8/4=2 (two)) element-array terminals Da through De at the same positions of the basic terminal arrangement (refer to FIG. 9).

Each of the groups 121 through 124 includes the G (for example, 1 (one)) first element-array terminals De (refer to FIG. 8) that are electrically coupled to each other. Each of the groups 121 through 124 includes the first element-array terminals De at the same positions of the basic terminal arrangement. G (for example, 1 (one)) is a reminder that results from the division of E (for example, 5 (five)) by A (for example, 4 (four)).

Each of the groups 121 through 124 includes the second element-array terminals Da (Db, Dc, or Dd) that are not electrically coupled to any other element-array terminals Da through De (refer to FIG. 8). Each of the groups 121 through 124 includes the second element-array terminals Da (Db, Dc, or Dd) at the same positions of the basic terminal arrangement (refer to FIG. 9).

Other details about the present exemplary embodiment correspond to the details of the first exemplary embodiment. The present exemplary embodiment can also achieves the advantageous effects described in the first embodiment.

Third Exemplary Embodiment

Figure 10:
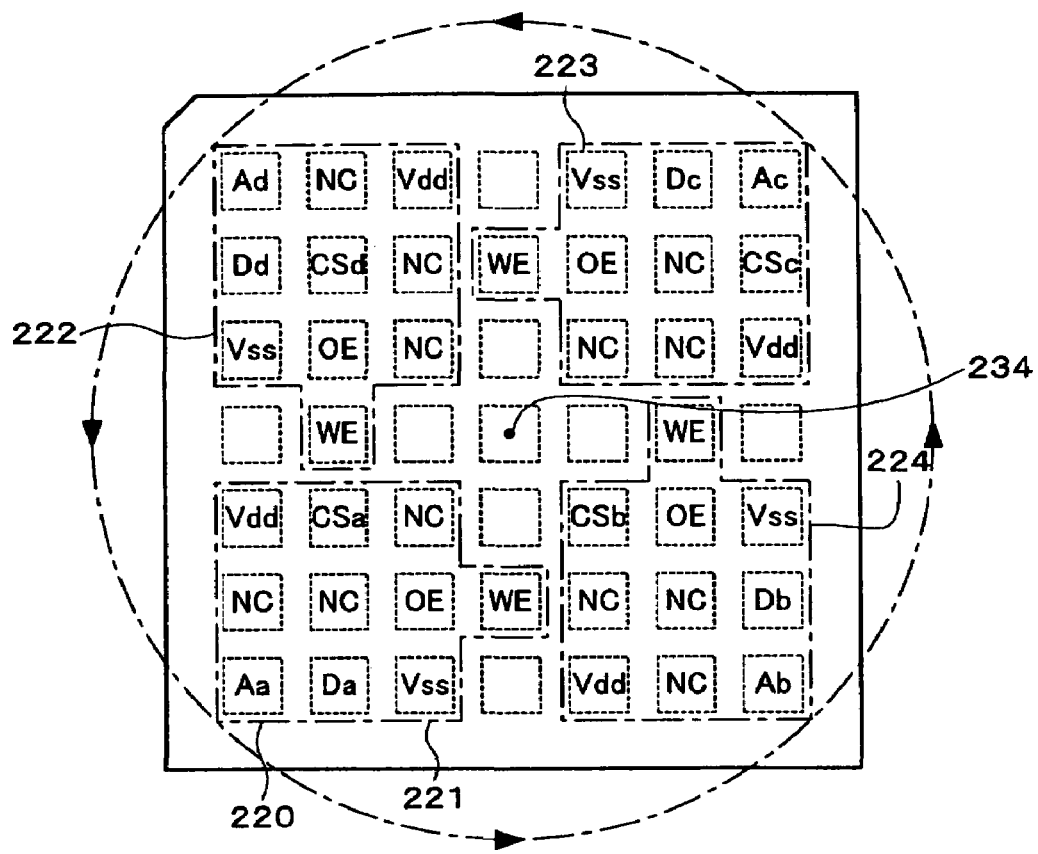
FIG. 10 is a schematic for explaining a semiconductor chip according to a third exemplary embodiment of the present invention.
Figure 10:
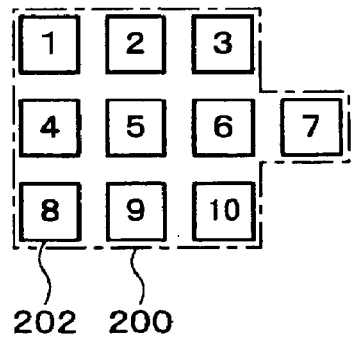

FIG. 10 is a schematic for explaining a semiconductor chip according to a third exemplary embodiment where the present invention is applied. In the present exemplary embodiment, a basic terminal arrangement 200 is different from the basic terminal arrangement 30 shown in FIG. 2. Specifically, in the basic terminal arrangement 200, a plurality of basic terminals 202 are arranged in a plurality of rows and columns. A plurality of terminals 220 in each of groups 221 through 224 are arranged in accordance with the basic terminal arrangement 200. In addition, the groups 221 through 224 each are disposed at each of positions that are defined by rotating one of the positions around a point 234.

Other details about the present exemplary embodiment correspond to the details of the first or second exemplary embodiment. The present exemplary embodiment can also achieves the advantageous effects described in the first exemplary embodiment.

Figure 11:
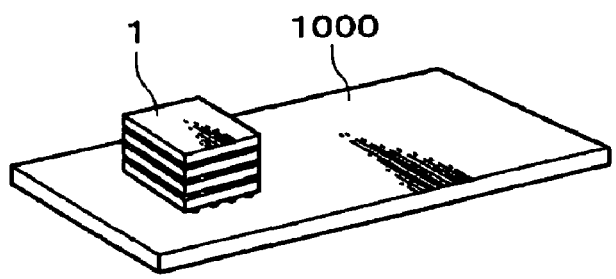
FIG. 11 is a schematic showing a circuit board where the semiconductor device according to an exemplary embodiment is mounted.
Figure 12:
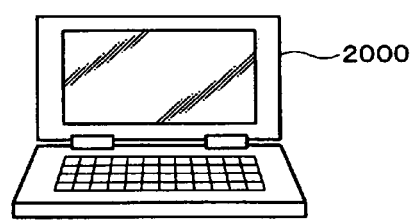
FIG. 12 is a schematic showing electronic equipment that has the semiconductor device according to an exemplary embodiment.
Figure 13:
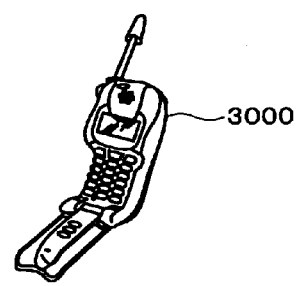
FIG. 13 is a schematic showing electronic equipment that has the semiconductor device according to an exemplary embodiment.

In FIG. 11, a circuit board 1000 where a semiconductor device 1 (or a semiconductor chip) explained in the above-described exemplary embodiments is mounted is shown. As electronic equipment having the semiconductor device (or semiconductor chip), a notebook personal computer 2000 is shown in FIG. 12, and a cellular phone 3000 is shown in FIG. 13.

The present invention is not limited to the above-described exemplary embodiments but applied to various kinds of modifications. For example, the invention includes substantially the same structure as that described in the exemplary embodiments (for example, a structure where a method and a result are the same, or a structure where an aim and a result are the same). In addition, the invention includes a structure obtained by replacing nonessential parts of the structure described in the exemplary embodiments. The invention includes a structure that can achieve the same action and advantageous effects as those of the structure described in the exemplary embodiments, or a structure that can achieve the same purpose as that thereof. In addition, the invention includes a structure obtained by adding the related art to the structure detailed in the exemplary embodiments.

What is claimed is:

1. A semiconductor device, comprising:
a plurality of stacked semiconductor chips having substantially the same structure, each of the semiconductor chips including a semiconductor substrate, terminals of A groups (A is an integer equal to or larger than 2 (two)) formed on the semiconductor substrate, each of the groups including a plurality of terminals and an integrated circuit formed on the semiconductor substrate,
the plurality of terminals in each of the groups being arranged in accordance with a predetermined basic terminal arrangement,
each of the groups being disposed at each of positions that are defined by rotating one of the positions around a point;
each of the groups including a group of contact/non-contact terminals at a same positions of the group of the basic terminal arrangement, the group of contact/non-contact terminals including a contact terminal that is electrically coupled to a same-function circuit and non-contact terminals that are electrically isolated from the same-function circuit;
the contact terminal being disposed at a different position of the basic terminal arrangement for each of the groups; and
the plurality of semiconductor chips being disposed so that the point of each of the semiconductor chips coincides with each other and each of the semiconductor chips being rotated around the point by each of angles different from each other, and thereby the groups whose positions of the contact terminal in the basic terminal arrangement are different from each other overlap, the terminals, which overlap, being electrically coupled to each other.

2. A semiconductor device, comprising:
a plurality of stacked semiconductor chips having substantially the same structure, each of the semiconductor chips including a semiconductor substrate, terminals of A groups (A is an integer equal to or larger than 2 (two)) formed on the semiconductor substrate, each of the groups including a plurality of terminals and an integrated circuit formed on the semiconductor substrate,
the plurality of terminals in each of the groups being arranged in accordance with predetermined basic terminal arrangement,
each of the groups being disposed at each of positions that are defined by rotating one of the positions around a point;
the integrated circuit includes a converter, the converter including B conversion input parts (B is an integer equal to or larger than 2 (two)) and having the function of selecting at least one signal among a group of predetermined output signals of the same kind in response to an input signal input to the conversion input parts,
the terminals of the groups including C conversion terminals (C is an integer equal to or larger than 2 (two)) that are electrically coupled to the conversion input parts, each of the conversion terminals being electrically coupled to one of the conversion input parts;
each of the groups including the conversion terminals in the number of C/A at the same positions of the basic terminal arrangement, and
the plurality of semiconductor chips being disposed so that the point of each of the semiconductor chips coincides with each other and the terminals of the groups of top-to-bottom overlap each other, the terminals, which overlap, being electrically coupled to each other.

3. A semiconductor device, comprising:
a plurality of stacked semiconductor chips having substantially the same structure each of the semiconductor chips including a semiconductor substrate, terminals of A groups (A is an integer equal to or larger than 2 (two)) formed on the semiconductor substrate, each of the groups including a plurality of terminals and an integrated circuit formed on the semiconductor substrate;
the plurality of terminals in each of the groups being arranged in accordance with predetermined basic terminal arrangement, each of the groups being disposed at each of positions that are defined by rotating one of the positions around a point, the integrated circuit including an element array that has a plurality of elements having the same function, and E element-array input parts (E is an integer equal to or larger than 2 (two)) for each being electrically coupled to any of the elements;
the terminals of the groups including F element-array terminals (F is an integer equal to or larger than 2 (two)) that are electrically coupled to the element-array input parts, each of the groups including the element-array terminals in the number of F/A at the same positions of the basic terminal arrangement; and
the plurality of semiconductor chips being disposed so that the point of each of the semiconductor chips coincides with each other and the terminals of the groups of top-to-bottom overlap each other, the terminals, which overlap, being electrically coupled to each other.

* * * * *